United States Patent [19]
Everage et al.

[11] Patent Number: 6,078,599
[45] Date of Patent: Jun. 20, 2000

[54] WAVELENGTH SHIFT CORRECTION TECHNIQUE FOR A LASER

[75] Inventors: George J. Everage; Igor V. Fomenkov, both of San Diego; Palash P. Das, Vista; Richard L. Sandstrom, Encinitas, all of Calif.

[73] Assignee: Cymer, Inc., San Diego, Calif.

[21] Appl. No.: 08/898,630

[22] Filed: Jul. 22, 1997

[51] Int. Cl.[7] .................................................. H01S 3/10
[52] U.S. Cl. ................................ 372/20; 372/25; 372/30; 372/32; 372/38
[58] Field of Search ................................. 372/20, 32, 38, 372/25, 30

[56] References Cited

U.S. PATENT DOCUMENTS

| | | | |
|---|---|---|---|
| 4,697,270 | 9/1987 | Galkowski | 372/25 |
| 4,798,467 | 1/1989 | Wyeth et al. | 372/32 |
| 4,817,101 | 3/1989 | Wyeth et al. | 372/20 |
| 4,940,331 | 7/1990 | Wyeth et al. | 372/32 |
| 5,025,445 | 6/1991 | Anderson et al. | 372/20 |
| 5,095,492 | 3/1992 | Sandstrom | 372/102 |
| 5,128,601 | 7/1992 | Orbach et al. | 372/25 |
| 5,371,587 | 12/1994 | de Groot et al. | 356/349 |
| 5,420,877 | 5/1995 | Sandstrom | 372/34 |
| 5,450,207 | 9/1995 | Fomenkov | 356/416 |
| 5,524,144 | 6/1996 | Suzuki | 359/176 |
| 5,691,989 | 11/1997 | Rakuljik et al. | 372/20 |
| 5,706,301 | 1/1998 | Lagerstrom | 372/32 |
| 5,754,571 | 5/1998 | Endoh et al. | 372/32 |

OTHER PUBLICATIONS

Ishihara, T., Sandstrom, R., Reiser, C., Sengupta, U., "Advanced Kryton Fluoride Excimer Laser for Microlithography", SPIE vol. 1674, Optical/Laser Microlithography V (1992) pp. 473–485, No Month.

*Primary Examiner*—Teresa M. Arroyo
*Assistant Examiner*—Robert E. Wise
*Attorney, Agent, or Firm*—Brian D. Ogonowsky

[57] ABSTRACT

A wavelength shift correction system for a laser system is provided for correcting wavelength chirps. This wavelength shift correction system includes a learning algorithm that learns characteristics of a wavelength chirp from a laser and a computer system that executes the learning algorithm and provides wavelength correction control signals based on the learned characteristics to reduce the magnitude of the wavelength shift of the present wavelength chirp and subsequent wavelength chirps.

18 Claims, 7 Drawing Sheets

WAVELENGTH SHIFT CORRECTION TECHNIQUE FOR A LASER

FIELD OF THE INVENTION

This invention relates to lasers and, in particular, to correcting wavelength shift in lasers.

BACKGROUND

Lasers are used for many applications. In one example, lasers are used in steppers for selectively exposing photoresist in a semiconductor wafer fabrication process. In such fabrication processes, the optics in the stepper are designed for a particular wavelength of the laser. The laser wavelength may drift over time and, thus, a feedback network is typically employed to detect the wavelength of the laser and correct the wavelength as necessary.

In one type of feedback network used to detect and adjust the wavelength of a laser, an etalon receives a portion of the emitted light from the laser. The etalon creates an interference pattern having concentric bands of dark and light levels due to destructive and constructive interference by the laser light. The concentric bands surround a center bright portion. The position of the bright center portion of the interference pattern is used to determine wavelength to a relatively coarse degree, such as to within 5 picometers (pm). The diameter of a light band is used to determine the wavelength of the laser to a fine degree, such as to within 0.01–0.03 pm. The width of a light band is used to determine the spectral width of the laser output. The interference pattern is usually referred to as a fringe pattern. The fringe pattern may be optically detected by a sensitive photodetector array.

Various methods are well known for wavelength tuning of lasers. Typically the tuning takes place in a device referred to as a line narrowing package or line narrowing module. A typical technique used for line narrowing and tuning of excimer lasers is to provide a window at the back of the discharge cavity through which a portion of the laser beam passes into the line narrowing package. There, the portion of the beam is expanded and directed to a grating which reflects a narrow selected portion of the laser's broader spectrum back into the discharge chamber where it is amplified. The laser is typically tuned by changing the angle at which the beam illuminates the grating. This may be done by adjusting the position of the grating or providing a mirror adjustment in the beam path. The adjustment of the grating position or the mirror position may be made by a mechanism which we will refer to as a laser wavelength adjustment mechanism.

FIG. 1 is a graph 10 which illustrates the wavelength drift over a burst of pulses from a laser. In particular, FIG. 1 indicates wavelength shift (i.e., wavelength drift from a desired wavelength output) of a maximum magnitude greater than about 0.1 pm. The circled section 12 of graph 10 indicates a large wavelength shift referred to as a wavelength chirp from the laser. As shown in FIG. 1, after the wavelength chirp, the wavelength output settles down to a wavelength shift of a maximum magnitude of less than about 0.05 pm. Conventional wavelength correction techniques do not adequately correct the large and sudden wavelength shifts in the wavelength chirp.

Excimer lasers operating in a burst mode also produce a pulse energy chirp similar to the wavelength chirp. Prior art methods have been disclosed to minimize the pulse energy chirp. One such method is described in an article by the inventors' co-workers, "Advanced Krypton Fluoride Excimer Laser for Microlithography, SPIE Vol. 1674, "Optical/Laser Microlithography V, (1992) 473–484, see page 480.

What is needed is a technique to correct the wavelength shift in the wavelength chirp of a laser.

SUMMARY

A wavelength shift correction system for a laser system is provided for correcting wavelength chirps. This wavelength shift correction system includes a learning algorithm that learns characteristics of a wavelength chirp from a laser and a computer system that executes the learning algorithm and provides wavelength correction control signals based on the learned characteristics to reduce the magnitude of the wavelength shift of the present and subsequent wavelength chirps. Mechanisms for generating a burst of laser beam pulses, detecting the wavelengths of the pulses, and adjusting the wavelength of the laser output are also described.

DETAILED DESCRIPTION OF THE PREFERRED EMBODIMENTS

FIGS. 2a, 2b, 2c and 2d are graphs 16, 18, 20 and 22, respectively, which illustrate the wavelength drift over four sequential bursts of pulses from a laser. Graphs 16, 18, 20 and 22 reveal that the shape or pattern of the wavelength drift of the wavelength chirp from a particular laser is similar from burst-to-burst. Data averaged over 60 pulses is shown as the solid lines in graphs 16, 18, 20 and 22.

Figure 1:
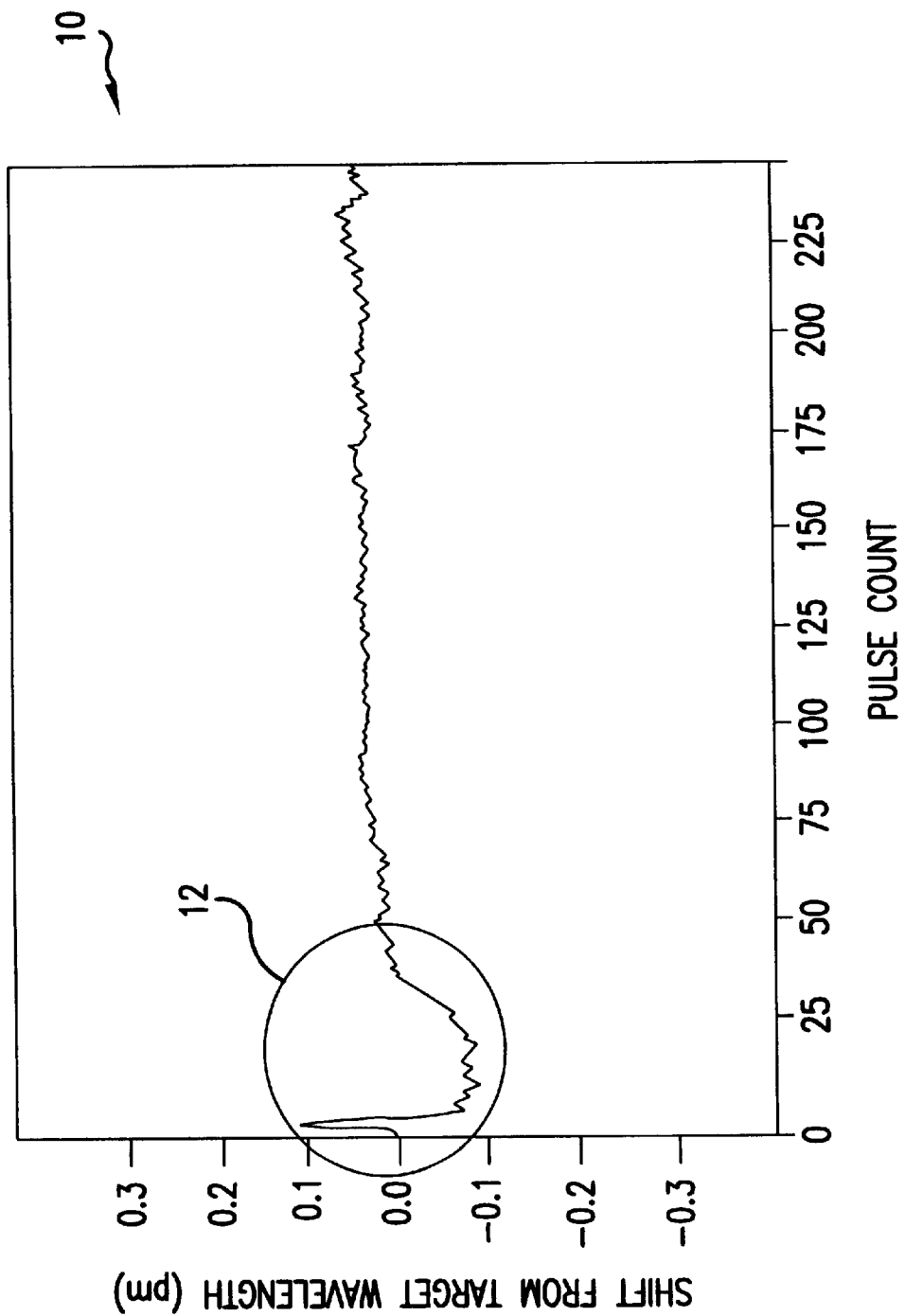
FIG. 1 is a graph of measurements of wavelength drift over a burst of pulses from a laser.
Figure 2A:
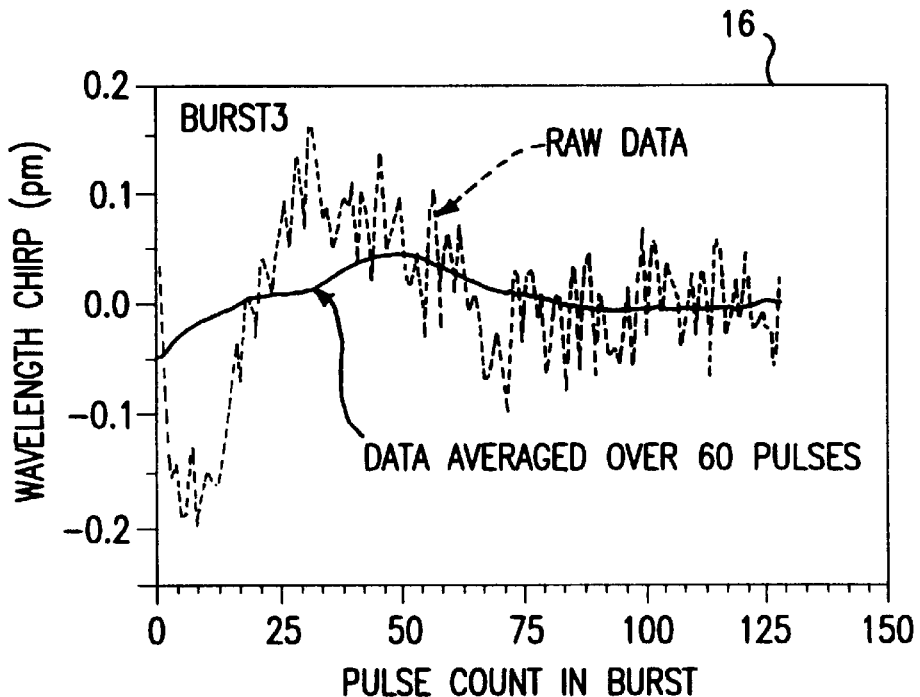
FIGS. 2a–d are graphs of measurements of wavelength drift over four sequential bursts of pulses from a laser.
Figure 2B:
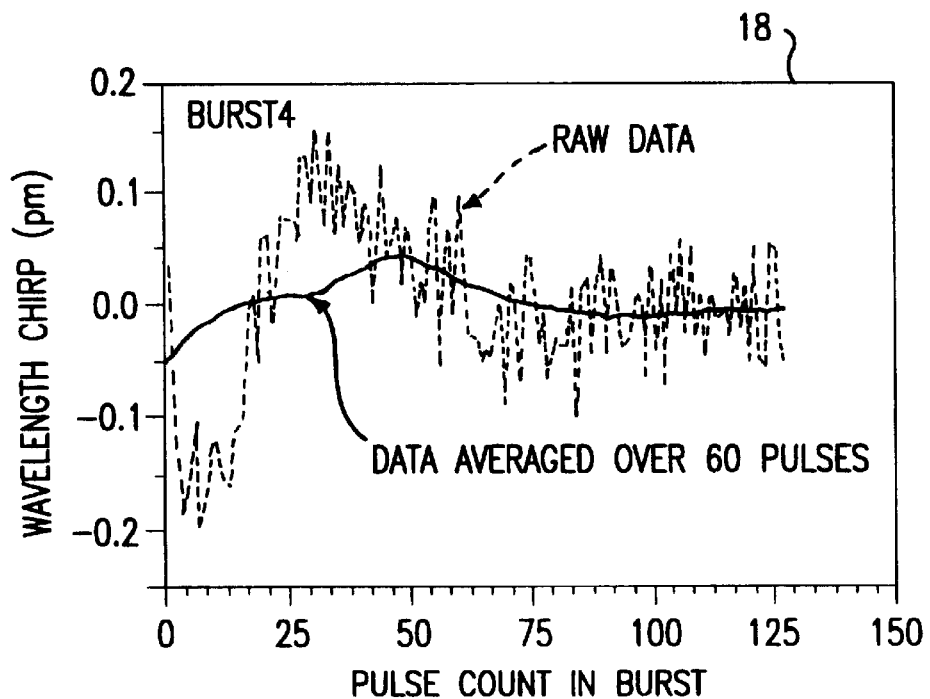
Figure 2C:
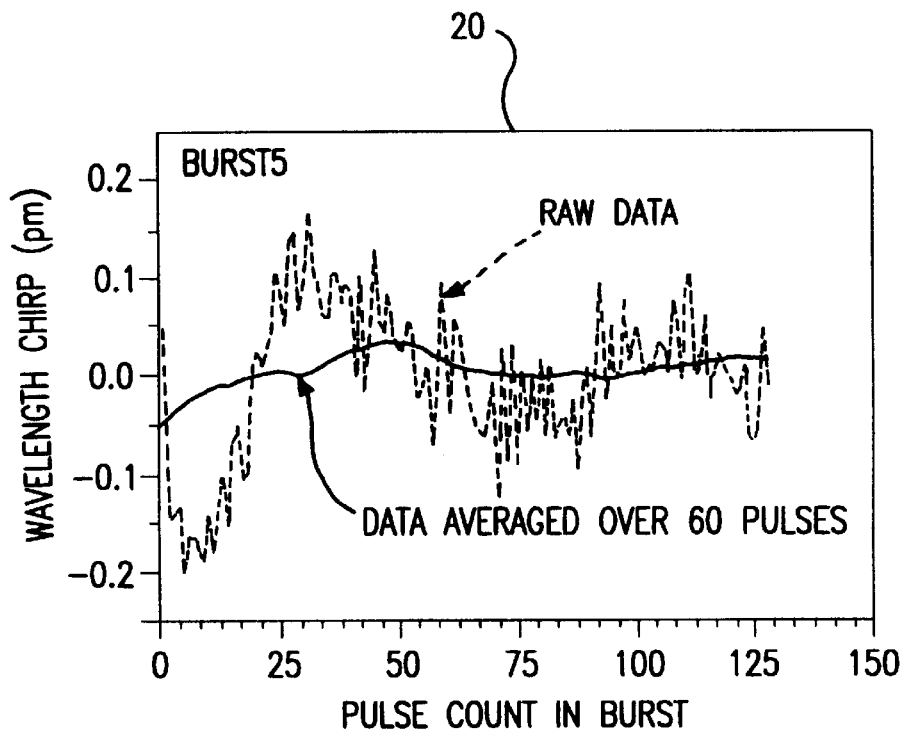
Figure 2D:
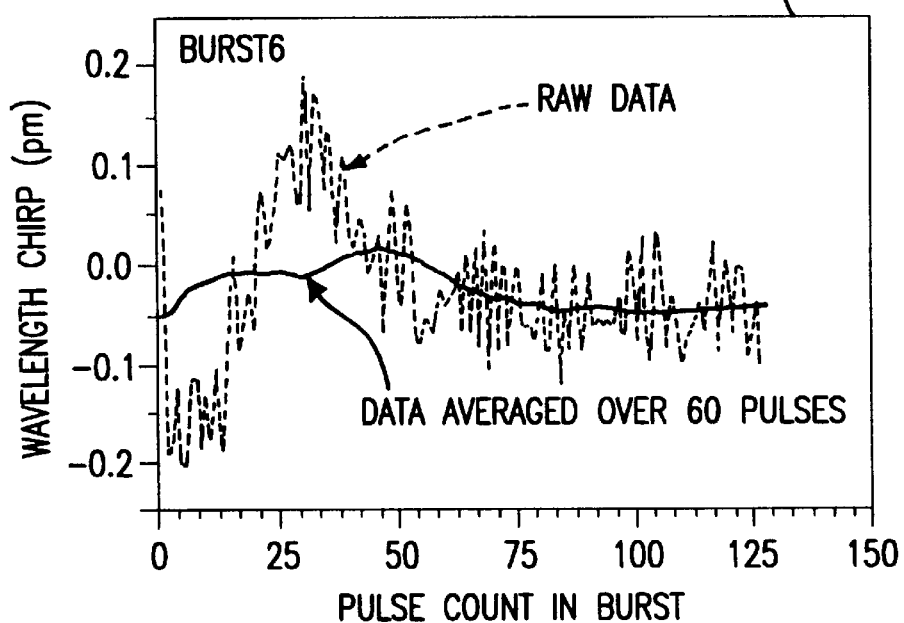
Figure 3:
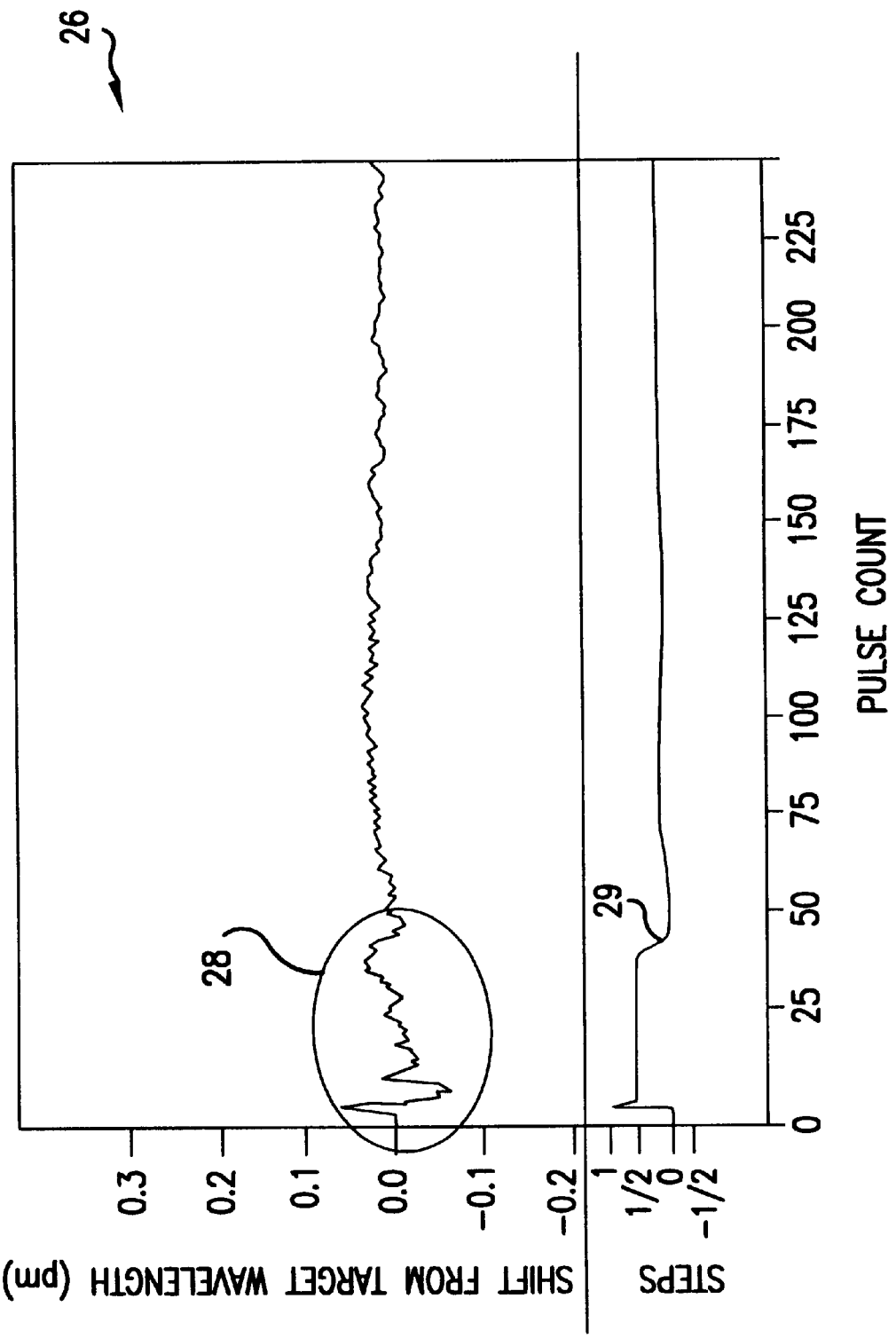
FIG. 3 is a graph of measurements of wavelength drift over a burst of pulses from a laser that has its wavelength output corrected in accordance with one embodiment of the present invention.

The graph 26 of FIG. 3 illustrates the wavelength shift over a burst of pulses from a laser that has its wavelength output corrected in accordance with one embodiment of the present invention. A circled section 28 of graph 26 reveals a significant reduction in the magnitude of wavelength drift during the wavelength chirp period of the laser, relative to the circled section 12 of graph 10 of FIG. 1. In particular, the magnitude of the maximum wavelength shift during the wavelength chirp period shown in graph 26 is about 0.05 pm.

Stepper motor control line 29 indicates that a stepper motor, which controls optical grating positions for tuning the laser, takes a full step up at the initiation of the burst, followed by a ½ step down at about pulse 4, followed by another ½ step down at about pulse 36. The step amounts and timing for the step adjustments, of course, varies for the particular system and varies for a particular burst.

Figure 4:
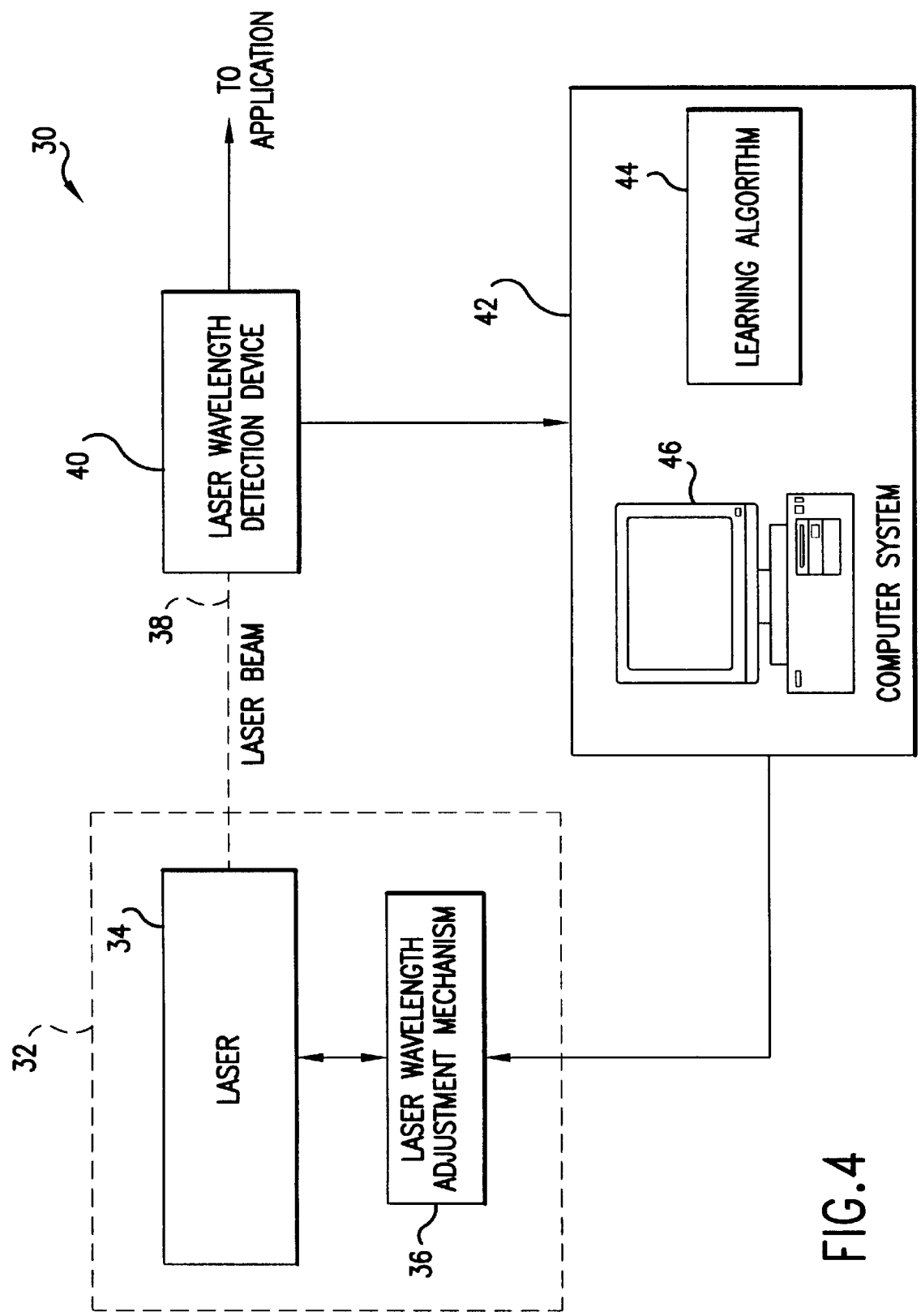
FIG. 4 illustrates the preferred embodiment of a wavelength shift correction system for a laser system.

FIG. 4 illustrates the preferred embodiment of a wavelength shift correction system 30 for a laser system 32. Laser system 32 includes a tunable laser 34. In one embodiment, laser 34 is an ultraviolet (UV) excimer laser which emits pulses of laser energy. Laser system 32 also includes a laser wavelength adjustment mechanism 36 to adjust the wavelength of laser 34. In one embodiment, laser wavelength adjustment mechanism 36 is capable of tuning laser 34 over a limited tunability range in a period of about 10–20 ms. Laser wavelength adjustment mechanism 36 may be any known laser wavelength adjustment mechanism. In the preferred embodiment, laser wavelength adjustment mechanism 36 includes a stepper motor or piezoelectric transducer controlling the angle at which a laser beam being tuned illuminates a grating located in a line narrowing module. The grating reflects a narrow range of wavelengths back into the laser excitation chamber for duplication. These wavelength adjustment mechanisms are well known in the art.

As laser 34 is being operated in an application, such as in a stepper for wafer fabrication, a portion of its emitted laser beam 38 is directed to a laser wavelength detection device 40. Laser wavelength detection device 40 may be a conventional device which detects the wavelength of laser beam 38. Further details regarding a suitable laser and optical elements for detecting and tuning the wavelength of laser light may be found in the following patents assigned to the present assignee and incorporated herein by reference: U.S. Pat. No. 5,025,445, entitled System For, and Method of, Regulating the Wavelength of a Light Beam, by Stuart Anderson et al.; U.S. Pat. No. 5,420,877, entitled Temperature Compensation Method and Apparatus for Wave Meters and Tunable Lasers Controlled Thereby, by Richard Sandstrom et al.; U.S. Pat. No. 5,095,492, entitled Spectral Narrowing Technique, by Richard Sandstrom; and U.S. Pat. No. 5,450,207, entitled Method and Apparatus for Calibrating a Laser Wavelength Control Mechanism, by Igor Fomenkov. The precise technique used to provide accurate wavelength detection is not relevant to this invention.

Laser wavelength detection device 40 accurately converts certain characteristics of laser beam 38 into digital signals for use by additional processing circuitry, such as a chirp acquisition system 42 described in detail below. The additional processing circuitry may use the digital signals to control the wavelength of tunable laser 34 and to determine various other characteristics of laser beam 38. Laser 34 may be tuned mechanically, optically, or chemically (e.g., by controlling the mixture of gases in laser 34), and the precise method used to tune the laser is not relevant to this invention.

In one embodiment, laser 34 emits pulses at 1000 pulses per second or greater. Ideally, laser wavelength detection device 40 detects the wavelength of each pulse in a burst of pulses from laser 34. Alternatively, laser wavelength detection device 40 may detect the wavelength of a sampled subset of pulses in the burst of pulses from laser 34.

Any technique used in the industry or described in any publication may be used in order to determine the wavelength of a pulse of laser beam 38 to an accuracy of, in one embodiment, 0.01–0.03 pm. Examples of various wavelength detection techniques and devices are described in the patents previously mentioned, incorporated herein by reference.

Laser wavelength detection device 40 is connected to a chirp acquisition system 42. Chirp acquisition system 42 includes a learning algorithm 44 that learns characteristics of a wavelength chirp from laser 34. Because the wavelength chirp from laser 34 may change over time and repeated usage, in one embodiment, learning algorithm 44 is scalable over time to learn changing characteristics of the wavelength chirp from laser 34. One skilled in the art would recognize that learning algorithm 44 can be implemented in any computer programming language. As indicated in FIG. 4, a computer system 46 executes learning algorithm 44. Computer system 46 may be, for example, a single microprocessor, a hard-wired logic circuit, or a more complex system such as one or more personal computers. Computer system 46 may also perform conventional wavelength correction after the wavelength chirp period.

Based on the learned characteristics of the wavelength chirp from laser 34, chirp acquisition system 42 sends control signals that contain correction terms to laser wavelength adjustment mechanism 36 for suitably adjusting the wavelength output of laser 34. As a result, the magnitudes of the wavelength shift during the wavelength chirp in the present and subsequent bursts of pulses from laser 34 are reduced, in one embodiment, to a magnitude of maximum wavelength shift of less than about 0.05 pm.

Figure 5:
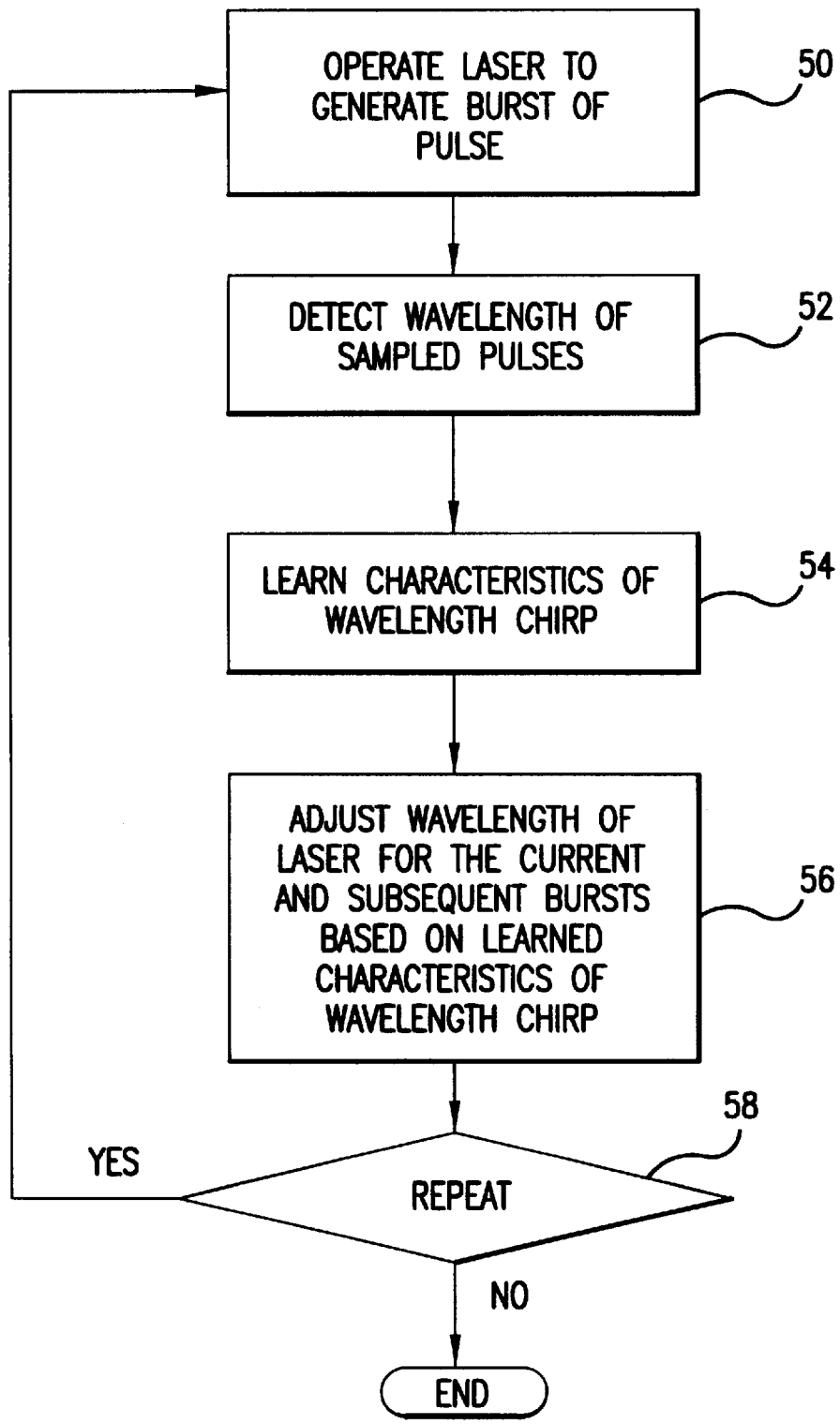
FIG. 5 is a flowchart of steps in accordance with one embodiment of the present invention.

FIG. 5 is a flowchart of steps in accordance with one embodiment of the present invention. In step 50, a laser is operated to generate a burst of pulses. In step 52, the wavelengths of sampled pulses are detected. The sampled pulses may constitute each pulse of the burst of pulses or a subset of pulses of the burst of pulses.

In step 54, characteristics of the wavelength chirp are learned. Step 54 will be described in greater detail with reference to FIG. 6.

In step 56, the wavelength output of the laser is adjusted for the current and subsequent bursts based on the learned characteristics of the current wavelength chirp and previous (if any) wavelength chirps. Steps 50, 52, 54 and 56 may be repeated as indicated in step 58. Alternatively, steps 52, 54 and 56 may be performed only after a predetermined number of bursts of pulses or periodically.

Figure 6:
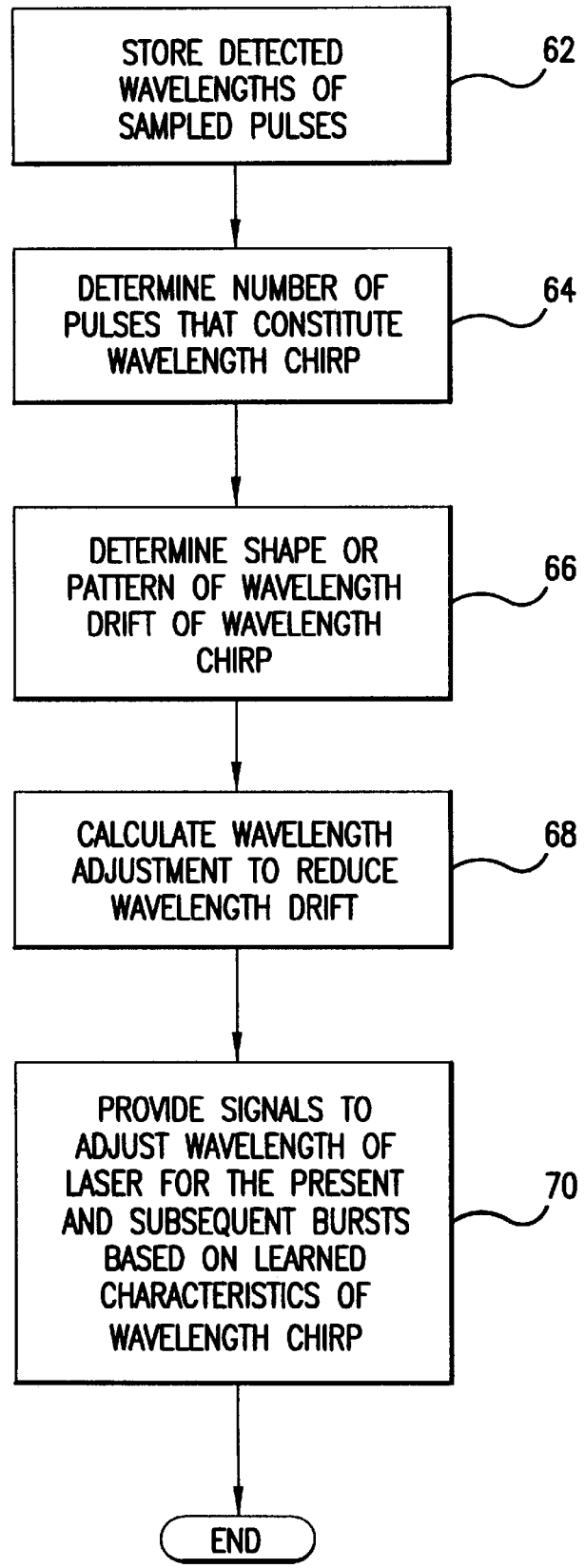
FIG. 6 is a flowchart that provides additional detail of the learning step of FIG. 4.

FIG. 6 is a flowchart that provides additional detail of learning step 54 and wavelength adjustment step 56 of FIG. 5. In step 62, the detected wavelengths of sampled pulses are stored. In step 64, the number of pulses that constitute the wavelength chirp are determined. The number of pulses that constitute the wavelength chirp period may be a predetermined number of pulses or dynamically determined according to when the wavelength shift settles down within a predetermined magnitude (e.g., less than about 0.05 pm).

In step 66, the wavelength shift of each sampled pulse is determined to learn the pattern or shape of the wavelength drift of the wavelength chirp. In step 68, the wavelength adjustment required to reduce or correct the wavelength drift for the present and subsequent wavelength chirps is calculated. In step 70, wavelength correction control signals are provided to dynamically adjust the wavelength output of the laser based on the learned characteristics of the wavelength chirp for the present burst and subsequent bursts. It is expected that the wavelength control signals during the wavelength chirp periods for a number of bursts will be significantly different from burst to burst for the first few bursts in a series of bursts and then be progressively similar after a number of bursts.

Accordingly, a technique for correcting wavelength shift in a tunable laser is described. Recognizing that the wavelength chirp from a particular laser is similar from burst-to-burst, characteristics of the wavelength chirp from the laser may be learned, and the learned characteristics may then be advantageously employed to reduce the magnitude of wavelength drift of the wavelength chirp in the present and subsequent bursts of pulses from the laser. By predicting the required wavelength shift during the wavelength chirp period, the wavelength correction system can act fast and make large wavelength shift changes which could not have been performed using conventional techniques.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A wavelength shift correction system for a laser, said laser emitting pulses of light in bursts, at least one of the initial pulses in each burst having a wavelength shift referred to as a wavelength chirp, said system comprising:

an algorithm that has input into said algorithm information representing at least wavelengths of light in a wavelength chirp in pulse bursts from a laser and, based on such information, calculates a probable correction needed for a wavelength chirp in future bursts; and a computer system that executes said algorithm and provides wavelength correction control signals, based upon said probable correction calculated by said algorithm, to reduce magnitudes of wavelength shift of a wavelength chirp.

2. The system of claim 1 further comprising:

a laser system connected to said computer system, said laser system comprising a tunable laser.

3. The system of claim 2 wherein said laser system further comprises a laser wavelength adjustment mechanism connected to said computer system for adjusting a light output characteristic of said tunable laser based upon said wavelength correction control signals output from said computer system.

4. The system of claim 3 wherein said laser wavelength adjustment mechanism is capable of tuning said tunable laser over a limited tuning range in about 10–20 ms.

5. The system of claim 2 further comprising:

a laser wavelength detection device connected is to said computer system that detects the magnitudes of wavelength shift of pulses from said tunable laser.

6. The system of claim 2 wherein said tunable laser comprises an ultra-violet excimer laser.

7. The system of claim 2 wherein the magnitude of a maximum wavelength shift of wavelength chirps from said tunable laser, after wavelength correction, is less than about 0.1 picometers.

8. The system of claim 2 wherein the magnitude of a maximum wavelength shift of wavelength chirps from said tunable laser, after wavelength correction, is less than about 0.05 picometers.

9. A method comprising:

receiving a wavelength output signal from a laser wavelength detection device;

determining wavelengths of light in a wavelength chirp from a laser, said laser emitting pulses of light in bursts, at least one of the initial pulses in each burst having a wavelength shift referred to as said wavelength chirp; and providing wavelength correction control signals to adjust the laser based on said wavelengths in at least one previous wavelength chirp in order to reduce magnitudes of wavelength shift of a present wavelength chirp and subsequent wavelength chirps from the laser.

10. The method of claim 9 further comprising:

operating the laser to generate multiple bursts of pulses.

11. The method of claim 10 further comprising:

detecting the wavelength shift of sampled pulses of the bursts of pulses from the laser.

12. The method of claim 9 wherein said step of determining further comprises:

storing the detected output of the laser wavelength detection device.

13. The method of claim 9 wherein said step of determining further comprises:

determining a number of pulses that constitute the wavelength chirp from the laser.

14. The method of claim 9 wherein said step of determining further comprises:

determining a shape or pattern of wavelength drift of the wavelength chirp from the laser.

15. The method of claim 9 wherein said step of determining further comprises:

calculating a wavelength adjustment required to reduce the magnitudes of wavelength shift of the present wavelength chirp and subsequent wavelength chirps from the laser.

16. A method comprising:

operating a laser to generate a burst of pulses, said laser emitting pulses of light in bursts, at least one of the initial pulses in each burst having a wavelength shift referred to as a wavelength chirp;

determining wavelengths of light in said wavelength chirp from the laser; and correcting magnitudes of wavelength shift of a present wavelength chirp and subsequent wavelength chirps from the laser based on said wavelengths in at least one previous wavelength chirp.

17. The method of claim 16 further comprising:

reducing magnitudes of wavelength shift of the wavelength chirp from the laser to less than about 0.05 parts per million.

18. The method of claim 16 further comprising:

reducing magnitudes of wavelength shift of the wavelength chirp from the laser to less than about 0.1 parts per million.

* * * * *